US007912166B2

(12) United States Patent
Hsu et al.

(10) Patent No.: US 7,912,166 B2
(45) Date of Patent: Mar. 22, 2011

(54) BUILT-IN JITTER MEASUREMENT CIRCUIT

(75) Inventors: Jen-Chien Hsu, Taichung (TW); Hung-Wen Lu, Taoyuan County (TW); Chau-Chin Su, Taipei (TW); Yeong-Jar Chang, Hsinchu County (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 774 days.

(21) Appl. No.: 11/870,113

(22) Filed: Oct. 10, 2007

(65) Prior Publication Data

US 2009/0096439 A1 Apr. 16, 2009

(51) Int. Cl.
*H04L 7/00* (2006.01)

(52) U.S. Cl. ........ 375/354; 375/355; 375/371; 375/373; 375/376; 327/141; 327/147; 327/156; 455/260; 455/516

(58) Field of Classification Search .................. 375/354, 375/355, 371, 373, 376; 327/141, 147, 156; 455/260, 516
See application file for complete search history.

(56) References Cited

U.S. PATENT DOCUMENTS

| | | | | |
|---|---|---|---|---|
| 5,663,991 | A | * | 9/1997 | Kelkar et al. ................ 375/376 |
| 6,396,889 | B1 | * | 5/2002 | Sunter et al. ................ 375/376 |
| 6,621,352 | B2 | * | 9/2003 | Matsumoto et al. .......... 331/1 A |
| 6,661,860 | B1 | | 12/2003 | Gutnik et al. |
| 6,987,410 | B2 | * | 1/2006 | Suda et al. ................... 327/165 |
| 7,023,195 | B2 | * | 4/2006 | Rosenbaum et al. ...... 324/76.53 |
| 7,453,255 | B2 | * | 11/2008 | Sunter et al. ............. 324/76.48 |
| 2005/0024037 | A1 | | 2/2005 | Fetzer |

OTHER PUBLICATIONS

Jui-Jer Huang et al., "An Infrastructure IP for On-Chip Clock Jitter Measurement" IEEE Computer Society, Proceedings of the IEEE International Conference on Computer Design, 2004.
Stephen Sunter et al., " BIST for Phase-Locked Loops in Digitals Applications" ITC International Test Conference, 1999 IEEE, pp. 532-539.

* cited by examiner

*Primary Examiner* — Leon Flores
(74) *Attorney, Agent, or Firm* — Winston Hsu; Scott Margo

(57) ABSTRACT

A jitter measurement circuit and a method for calibrating the jitter measurement circuit are disclosed. The jitter measurement circuit includes a synchronous dual-phase detector and a decision circuit. In a test mode, a probability distribution function (PDF) of the jitter of a clock signal output by a circuit under test is obtained. In a calibration mode, a random clock, which is externally generated or generated by a free-run oscillator in the circuit under test, is used to calibrate the synchronous dual-phase detector. The decision circuit performs logic operations, data latching and counting on a phase relationship detected by the synchronous dual-phase detector in order to obtain a counting value and a PDF relative to the jitter of the clock signal.

17 Claims, 5 Drawing Sheets

BUILT-IN JITTER MEASUREMENT CIRCUIT

BACKGROUND OF THE INVENTION

1. Field of the Invention

The present invention generally relates to a jitter measurement circuit, in particular, to a built-in clock jitter measurement circuit.

2. Description of Related Art

When a data pulse is transmitted on a transmission line, problem may be caused in a clock recovery circuit (CDR) or a phase lock loop (PLL) or the data may even be lost if a data jitter appears. Jitter is a deviation between the real timing and the ideal timing of rising edges (or falling edges) of a signal. FIG. 1 illustrates the definition of jitter. Jitter may negatively affect bit error rates (BER) of receivers and reduce the quality of service of systems.

Generally speaking, jitter appears as two distinct types: deterministic jitter (DJ) and random jitter (RJ). RJ usually presents a Gaussian distribution, or referred as normal distribution.

Presently, an external automatic test equipment (ATE) may be used for measuring jitter. However, since signals have to be output to the ATE, they have to go through the input/output pins. Thus, the measured jitter may not be original. Besides, high cost of ATEs increases testing cost.

Accordingly, a built-in self-test (BIST) circuit capable of performing accurate jitter measurement is to be developed for reducing testing cost, testing time, and prevent usage of external test equipment.

SUMMARY OF THE INVENTION

Accordingly, the present invention is directed to a built-in jitter measurement circuit which offers accurate jitter measurement, reduces testing cost, testing time, and prevents usage of test equipment.

The present invention is directed to a built-in jitter measurement circuit, wherein the built-in jitter measurement circuit calibrates a delay buffer in a synchronous dual-phase detector to provide accurate jitter measurement.

The present invention is directed to a built-in jitter measurement circuit, wherein a synchronous dual-phase detector is reset after every sampling in order to reduce the hysteresis effect.

According to an example of the present invention, a built-in jitter measurement circuit for measuring the jitter of a clock signal is provided. The jitter measurement circuit includes a synchronous dual-phase detector and a decision circuit. The synchronous dual-phase detector respectively delays the clock signal and a reference clock signal and detects a phase relationship between the delayed clock signal and the delayed reference clock signal. The decision circuit performs logic operations, data latching, and counting on the phase relationship detected by the synchronous dual-phase detector to obtain a counting value and a probability distribution function (PDF) related to the jitter of the clock signal.

According to another example of the present invention, a time difference measurement circuit for measuring a time difference between a reference clock signal and a clock signal output by a circuit under test is provided, wherein the circuit under test includes at least an oscillator. The time difference measurement circuit includes a synchronous dual-phase detector and a decision circuit. The synchronous dual-phase detector is coupled to the circuit under test, and the synchronous dual-phase detector includes a first delay buffer and a second delay buffer. When the oscillator operates normally, a PDF of a phase of the clock signal is obtained, and a delay amount difference on the reference clock signal by the first delay buffer and the second delay buffer is calibrated according to the PDF of the phase of the clock signal. The decision circuit is coupled to the synchronous dual-phase detector and performs logic operations, data latching, and counting on a phase relationship detected by the synchronous dual-phase detector to obtain a counting value related to the time difference between the reference clock signal and the clock signal.

According to yet another example of the present invention, a time difference measurement circuit for measuring a time difference between a reference clock signal and a clock signal output by a circuit under test is provided, wherein the circuit under test includes at least an oscillator. The time difference measurement circuit includes a synchronous dual-phase detector and a decision circuit. The synchronous dual-phase detector is coupled to the circuit under test, and the synchronous dual-phase detector includes a first delay buffer and a second delay buffer. When the oscillator is in a free run, a PDF of a phase of the clock signal is obtained, and a delay amount difference on the reference clock signal by the first delay buffer and the second delay buffer is calibrated according to the PDF of the phase of the clock signal. The decision circuit is coupled to the synchronous dual-phase detector and performs logic operations, data latching, and counting on a phase relationship detected by the synchronous dual-phase detector to obtain a counting value related to the time difference between the reference clock signal and the clock signal.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
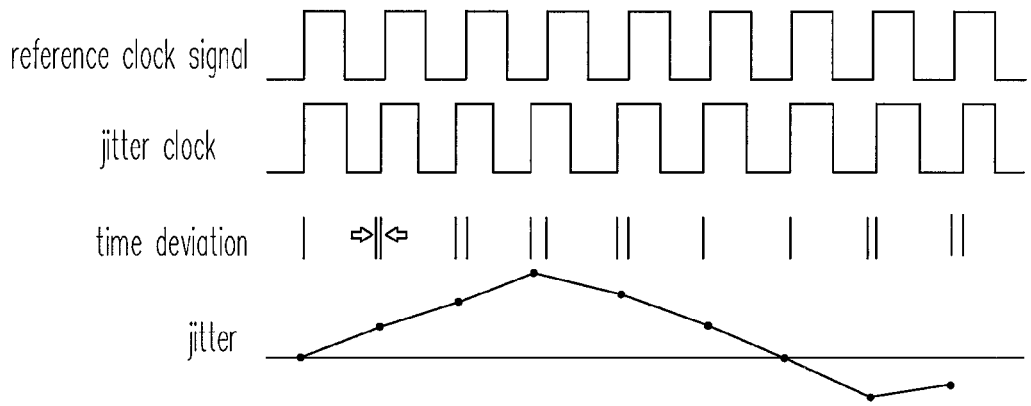
FIG. 1 illustrates definition of jitter.

Reference will now be made in detail to the present preferred embodiments of the invention, examples of which are illustrated in the accompanying drawings. Wherever possible, the same reference numbers are used in the drawings and the description to refer to the same or like parts.

The features, aspects, and advantages of the present invention will be described and become more apparent from the detailed description of embodiments of the present invention when read in conjunction with accompanying drawings.

Figure 2:
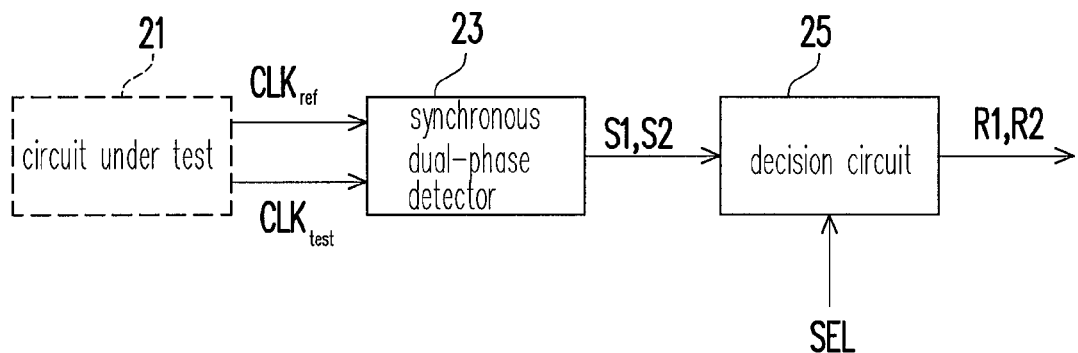
FIG. 2 is a block diagram of a built-in jitter measurement circuit according to a first embodiment of the present invention.

FIG. 2 is a block diagram of a built-in jitter measurement circuit according to a first embodiment of the present invention. Referring to FIG. 2, the jitter measurement circuit includes a synchronous dual-phase detector 23 and a decision circuit 25. The jitter measurement circuit is used for detecting jitters of a clock signal CLKtest, namely, errors of the clock signal CLKtest relative to a reference clock signal CLKref output by a circuit 21. The circuit 21 may be a phase lock loop (PLL), a clock recovery circuit (CDR), a delay locked loop (DLL), or other circuit which can generate a clock signal according to a reference clock signal.

The synchronous dual-phase detector 23 detects a phase relationship between the clock signal CLKtest and the reference clock signal CLKref and outputs two signals S1 and S2 to the decision circuit 25. The decision circuit 25 counts the signals S1 and S2 to obtain two counting values R1 and R2, and sends the two counting values R1 and R2 to a back-end computing unit or a back-end computing software (not shown) to obtain a jitter value and the root mean square (RMS) value thereof.

Figure 3:
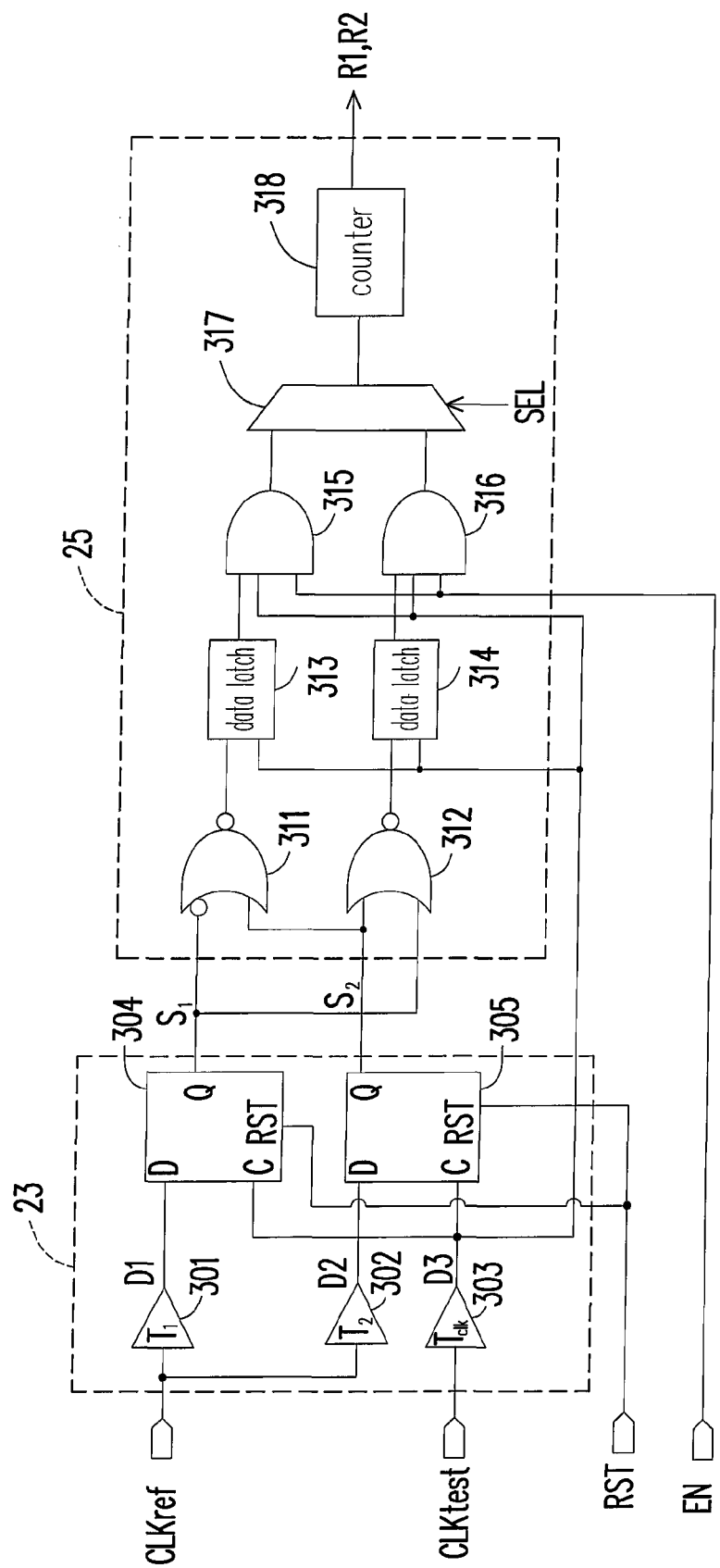
FIG. 3 is a circuit diagram of a synchronous dual-phase detector and a decision circuit in FIG. 2.

FIG. 3 is a circuit diagram of the synchronous dual-phase detector 23 and the decision circuit 25. The synchronous dual-phase detector 23 includes delay buffers 301~303 and phase detectors 304~305. The decision circuit 25 includes logic circuits 311~312, data latches 313~314, logic circuits 315~316, a multiplexer 317, and a counter 318.

The delay buffers 301 and 302 respectively delay the reference clock signal CLKref to generate delayed reference clock signals D1 and D2. The delay buffer 303 delays the clock signal CLKtest to generate a delayed clock signal D3. The delays by the delay buffers 301~303 are different and further adjustable. For example, the delay buffer 301 provides the smallest delay, the delay provided by the delay buffer 303 is greater than that provided by the delay buffer 301, and the delay buffer 302 provides the greatest delay.

The phase detectors 304 and 305 may be D flip-flops (DFFs). The phase detectors 304 and 305 respectively have a data input terminal D, a clock input terminal C, a reset terminal RST, and a data output terminal Q. The data input terminals D of the phase detectors 304 and 305 respectively receive the delayed reference clock signals D1 and D2. The clock input terminals C of the phase detectors 304 and 305 both receive the delayed clock signal D3. The reset terminals RST of the phase detectors 304 and 305 both receive a reset signal RST. The data output terminals Q of the phase detectors 304 and 305 respectively output signals S1 and S2.

The signal S1 (having value 1 or 0) represents the phase relationship between the delayed reference clock signal D1 and the delayed clock signal D3. The signal S2 (having value 1 or 0) represents the phase relationship between the delayed reference clock signal D2 and the delayed clock signal D3.

Additionally, in the present embodiment, the phase detectors 304 and 305 are reset by the reset signal RST after every sampling (i.e. every time the signals S1 and S2 are generated) in order to avoid the hysteresis effect.

The logic circuits 311 and 312 receive the output signals S1 and S2 of the phase detectors 304 and 305. The data latches 313 and 314 latch the output signals of the logic circuits 311 and 312 according to the delayed clock signal D3. The logic circuits 315 and 316 receive the output signals of the data latches 313 and 314, the delayed clock signal D3, and an enabling signal EN generated by an external test equipment. The data latches 313 and 314 and the logic circuits 315 and 316 are together to generate a pulse signal. The logic circuits 315 and 316 output the pulse signal if the output signals of the logic circuits 311 and 312 are 1, and the logic circuits 315 and 316 do not output the pulse signal if the output signals of the logic circuits 311 and 312 are 0.

The multiplexer 317 selects one of the outputs of the logic circuits 315 and 316 according to a selection signal SEL. The counter 318 counts the output signal of the multiplexer 317 and generates the counting values R1 and R2. The counter 318 may be a ripple counter. By using the data latches 313 and 314 and the counter 318, the speed of jitter measurement may be greatly increased.

The built-in self-test (BIST) circuit in the present embodiment has two operation modes: a test mode and a calibration mode. In the test mode, an oscillator (for example, a voltage-controlled oscillator, VCO) of the circuit under test operates normally, while in the calibration mode, the oscillator is in free run. However, in other embodiments of the present invention, the clock signal CLKtest may also be provided from external in the calibration mode. In other words, in the calibration mode, the random clock signal may be provided from external, or, the random clock signal may also be generated by the free-run oscillator in the circuit under test.

Figure 4:
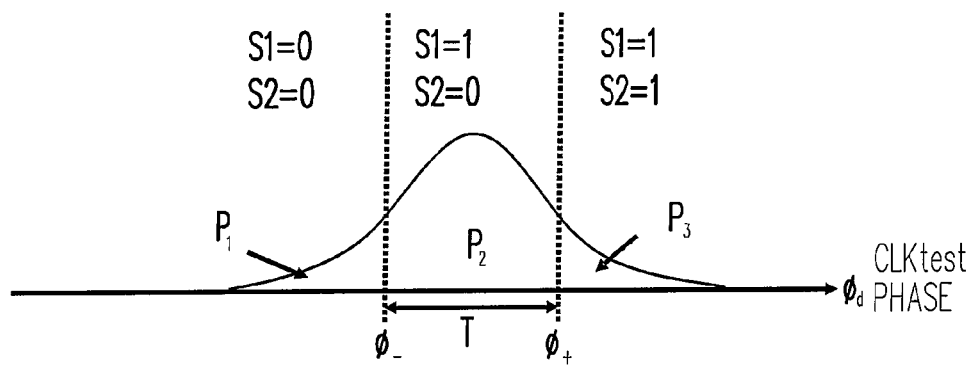
FIG. 4 illustrates a probability distribution function (PDF) of a phase of a clock signal in a test mode.

FIG. 4 illustrates a probability distribution function (PDF) of a phase $\phi d$ of the clock signal CLKtest in the test mode. It is assumed that the jitter presents normal distribution in the test mode. The phase $\phi d$ of the clock signal CLKtest can be divided into three sections according to the values of the signal S1 and S2, wherein the three sections are defined by: smaller than $\phi_-$ (when S1=0 and S2=0); between $\phi_-$ and $\phi_+$ (when S1=1 and S2=0); and greater than $\phi_+$ (when S1=1 and S2=1).

In FIG. 4, P1~P3 respectively represent the areas of foregoing three sections (i.e. P1+P2+P3=1), namely, the probabilities of the phase $\phi d$ being in foregoing three sections. For example, P1=R1/NS (NS: number of samplings), and P2=R2/NS. T represents the range of the phase $\phi d$ when S1=1 and S2=0.

Figure 5:
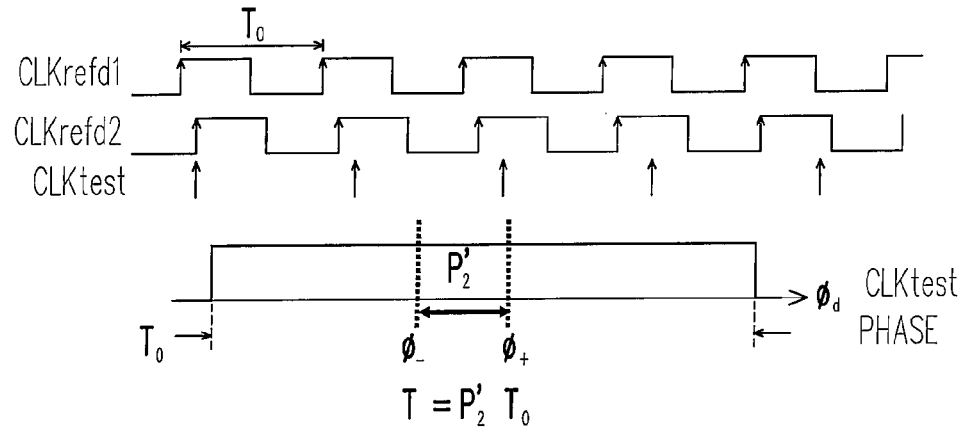
FIG. 5 illustrates a PDF of a phase of a clock signal in a calibration mode.

FIG. 5 illustrates a PDF of the phase $\phi d$ of the clock signal CLKtest in the calibration mode. The clock signal CLKtest is generated randomly from the free run oscillator of the circuit under test. In other words, the clock signal CLKtest is not related to the reference clock signal CLKref, and the PDF of the phase $\phi d$ of the clock signal CLKtest presents uniform distribution. T0 represents the cycle of the reference clock signal CLKref (or the cycle of the delayed reference clock signal D1). T represents a delay amount difference between the delay buffers 301 and 302. CLKrefd1 and CLKrefd2 respectively represent the delayed reference clock signals D1 and D2 generated by the delay buffers 301 and 302. According to the statistic characteristic that the PDF of the phase $\phi d$ of the clock signal CLKtest presents uniform distribution when the oscillator of the circuit under test is in free run, T=P2'*T0. The delay amount difference between the delay buffers 301 and 302 can be obtained according to T0 and P2'.

Figure 6:
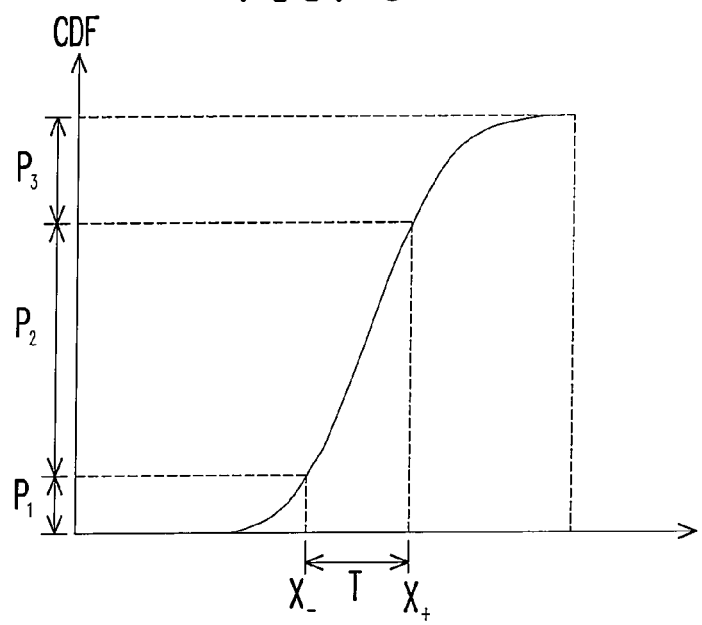
FIG. 6 illustrates a cumulative distribution function (CDF) of a phase of a clock signal.

FIG. 6 illustrates a cumulative distribution function (CDF) of the phase $\phi d$ of the clock signal CLKtest, wherein the horizontal ordinate is the phase $\phi d$ of the clock signal CLKtest in unit of the root mean square (RMS) value ($\sigma$) of the phase $\phi d$. The phase errors $x_-$ and $x_+$ (in unit of $\sigma$) can be obtained from FIG. 6 according to P1 and P2. The value of T can be calculated according to P2'. After that, a phase corresponding to $\sigma$ can be obtained through the relationship between T and $x_-$, $x_+$, which is expressed as:

$$\sigma = T/(x_+ - x_-)$$

For example, when P1=0.100 and P2=0.5414, the corresponding $x_-$ is −1.23 and the corresponding $x_+$ is +0.39. P2'=0.04 and T=0.04 T0. Thus, $\sigma$=0.04 T0/(0.39−(−1.23))= 0.025 T0.

Figure 7:
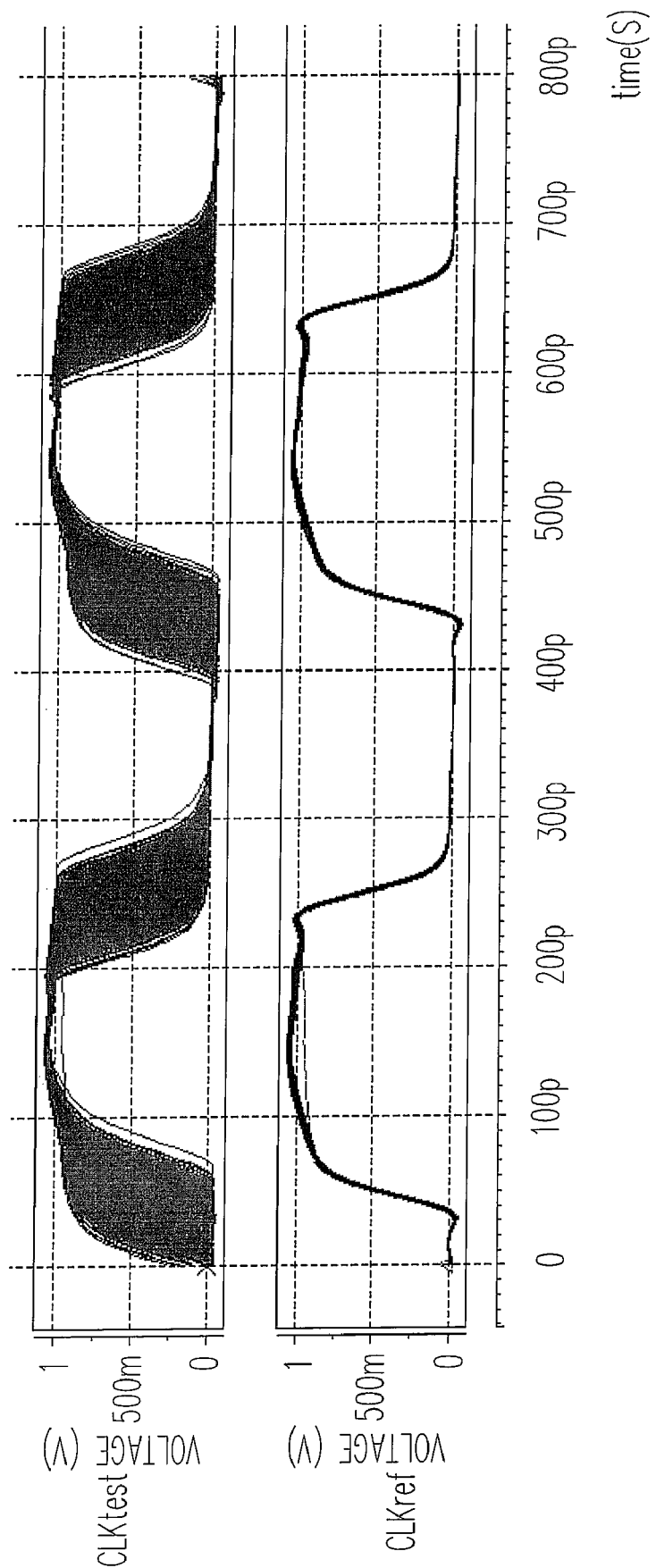
FIG. 7 illustrates a simulation result of the first embodiment of the present invention.

FIG. 7 illustrates a simulation result of the first embodiment of the present invention, wherein the reference clock signal CLKref is 2.5 GHz, and the jitter σ of the clock signal CLKtest is 10 ps (=0.025UI).

The difference made by whether inputting the reset signal RST to the phase detectors or not can be observed from following two jitter error comparison tables.

Table 1 shows the jitter error comparison result without inputting the reset signal RST to the phase detectors.

TABLE 1

|  | P1 | P2 | T | Error |
|---|---|---|---|---|
| Ideal calibration state | 0.0809 | 0.5686 | 0.0409 | 8.1% |
| Calibration state 1 | 0.0809 | 0.5686 | 0.0375 | 15.9% |
| Calibration state 2 | 0.0809 | 0.5686 | 0.0380 | 14.8% |
| Calibration state 3 | 0.0809 | 0.5686 | 0.0369 | 17.2% |

The ideal calibration state in foregoing table 1 refers to that in the calibration mode, the clock signal CLKtest in FIG. 2 may be a controllable clock signal (generated by a signal generator). The PDF of the phase ϕd of the controllable clock signal presents uniform distribution, and the phase difference between the controllable clock signal and the reference clock signal presents uniform distribution. Accordingly, accurate calibration may be performed. In foregoing table 1, the results in the calibration states 1~3 are respectively obtained under different free-run oscillation frequencies.

Table 2 shows the jitter error comparison result with the reset signal RST being input to the phase detectors.

TABLE 2

|  | P1 | P2 | T | Error |
|---|---|---|---|---|
| Ideal calibration state | 0.1100 | 0.5414 | 0.0400 | 1% |
| Calibration state 1 | 0.1100 | 0.5414 | 0.0389 | 3.8% |
| Calibration state 2 | 0.1100 | 0.5414 | 0.0392 | 3.0% |
| Calibration state 3 | 0.1100 | 0.5414 | 0.0379 | 6.1% |

It can be observed from foregoing table 1 and table 2 that when the reset signal RST is input to the phase detectors, jitter error is smaller.

Figure 8:
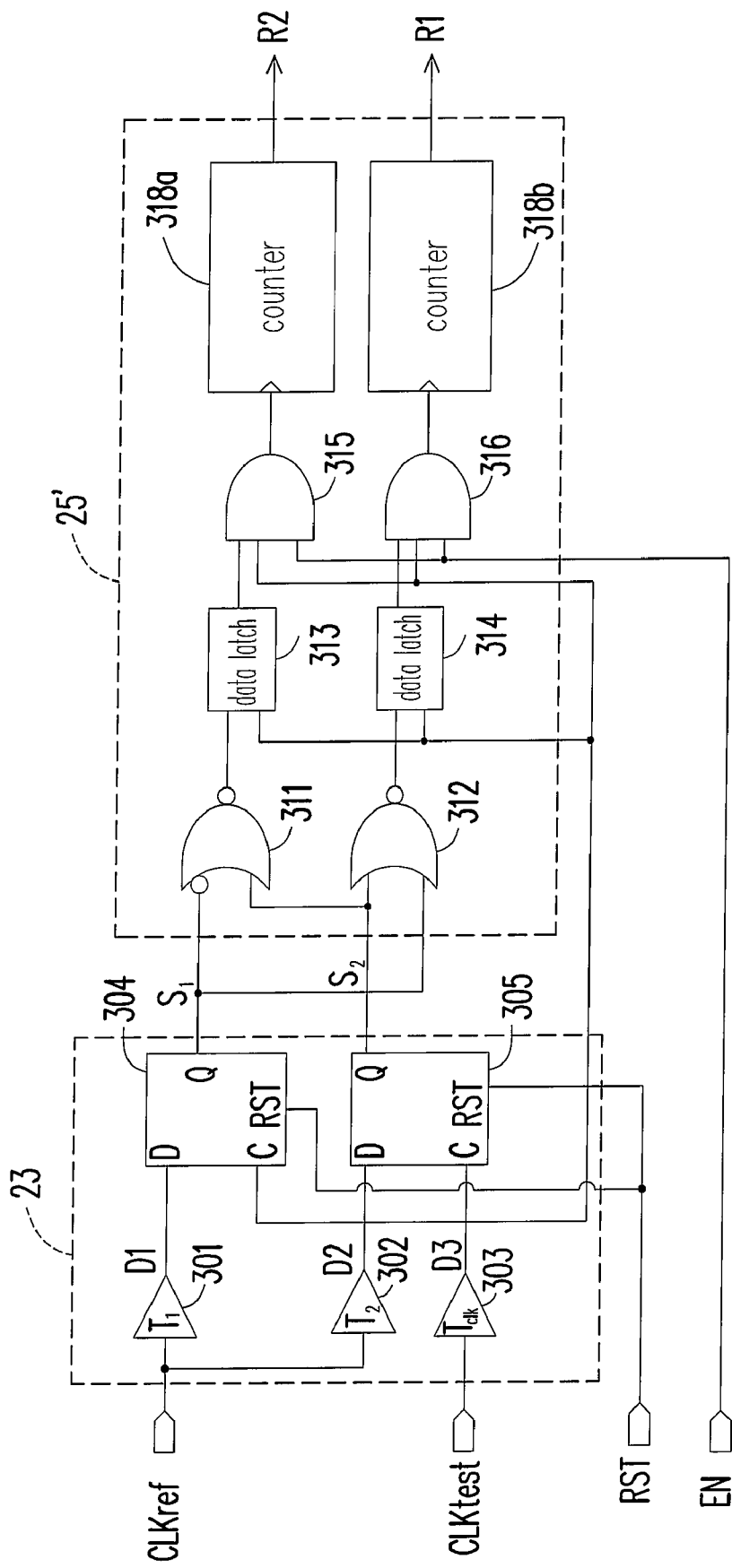
FIG. 8 is a circuit diagram of a built-in jitter measurement circuit according to a second embodiment of the present invention.

FIG. 8 is a circuit diagram of a built-in jitter measurement circuit according to a second embodiment of the present invention. Substantially, the structure of the BIST circuit in the present embodiment is similar to that in the first embodiment, but the multiplexer 317 and the counter 318 in FIG. 2 are replaced by a counter 318a and a counter 318b. The operation details of the present embodiment can be understood by referring to foregoing description of the first embodiment therefore will not be described herein.

In overview, the built-in jitter measurement circuit provided by the present invention has at least such advantages as small circuit area, high operation speed, and high accuracy.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A built-in jitter measurement circuit, for measuring a jitter of a clock signal output by a circuit under test relative to a reference clock signal, the jitter measurement circuit comprising: a synchronous dual-phase detector, coupled to the circuit under test, for delaying the clock signal and the reference clock signal and detecting a phase relationship between the delayed clock signal and the delayed reference clock signal, wherein the delays of the clock signal and the reference clock signal are different; and a decision circuit, coupled to the synchronous dual-phase detector, for performing logic operations, data latching, and counting on the phase relationship detected by the synchronous dual-phase detector to obtain a counting value related to the jitter of the clock signal, wherein the synchronous dual-phase detector comprises: a first delay buffer, delaying the reference clock signal to generate a first delayed reference clock signal; a second delay buffer, delaying the reference clock signal to generate a second delayed reference clock signal; a third delay buffer, delaying the clock signal to generate the delayed clock signal; a first phase detector, coupled to the first delay buffer and the third delay buffer for detecting a phase relationship between the first delayed reference clock signal and the delayed clock signal; and a second phase detector, coupled to the second delay buffer and the third delay buffer for detecting a phase relationship between the second delayed reference clock signal and the delayed clock signal; wherein the delay of the third delay buffer is between the delay of the first delay buffer and the delay of the second delay buffer; and the first phase detector and the second phase detector are reset after every sampling.

2. The jitter measurement circuit according to claim 1, wherein the decision circuit comprises:
a first logic circuit, performing logic operations on an output signal of the first phase detector and an output signal of the second phase detector;
a second logic circuit, performing logic operations on the output signal of the first phase detector and the output signal of the second phase detector;
a first data latch, latching an output signal of the first logic circuit according to the delayed clock signal; and
a second data latch, latching an output signal of the second logic circuit according to the delayed clock signal.

3. The jitter measurement circuit according to claim 2, wherein the decision circuit comprises
a third logic circuit, performing logic operations on an output signal of the first data latch, the delayed clock signal, and an enabling signal; and
a fourth logic circuit, performing logic operations on an output signal of the second data latch, the delayed clock signal, and the enabling signal.

4. The jitter measurement circuit according to claim 3, wherein the decision circuit comprises
a multiplexer, selecting from an output signal of the third logic circuit and an output signal of the fourth logic circuit; and
a first counter, counting an output signal of the multiplexer.

5. The jitter measurement circuit according to claim 3, wherein the decision circuit comprises:
a second counter, counting an output signal of the third logic circuit; and
a third counter, counting an output signal of the fourth logic circuit.

6. A time difference measurement circuit, for measuring a time difference between a reference clock signal and a clock signal output by a circuit under test comprising at least an oscillator, the time difference measurement circuit comprising: a synchronous dual-phase detector, coupled to the circuit under test, comprising a first delay buffer and a second delay buffer, wherein the first delay buffer and the second delay buffer delay the reference clock signal, and when the oscillator operates normally, a probability distribution function (PDF) of a phase of the clock signal is obtained, and a delay amount difference on the reference clock signal by the first delay buffer and the second delay buffer is calibrated according to the PDF of the phase of the clock signal; and a decision circuit, coupled to the synchronous dual-phase detector, for performing logic operations, data latching, and counting on a phase relationship detected by the synchronous dual-phase detector to obtain a counting value related to the time difference between the reference clock signal and the clock signal, wherein the first delay buffer delays the reference clock signal to generate a first delayed reference clock signal, the second delay buffer delays the reference clock signal to generate a second delayed reference clock signal, and the synchronous dual-phase detector further comprises a third delay buffer which delays the clock signal to generate the delayed clock signal; wherein the delay of the third delay buffer is between the delay of the first delay buffer and the delay of the second delay buffer.

7. The time difference measurement circuit according to claim 6, wherein the synchronous dual-phase detector comprises:
- a first phase detector, coupled to the first delay buffer and the third delay buffer for detecting a phase relationship between the first delayed reference clock signal and the delayed clock signal; and
- a second phase detector, coupled to the second delay buffer and the third delay buffer for detecting a phase relationship between the second delayed reference clock signal and the delayed clock signal;
- wherein the first phase detector and the second phase detector are reset after every sampling.

8. The time difference measurement circuit according to claim 7, wherein the decision circuit comprises:
- a first logic circuit, performing logic operations on an output signal of the first phase detector and an output signal of the second phase detector;
- a second logic circuit, performing logic operations on the output signal of the first phase detector and the output signal of the second phase detector;
- a first data latch, latching an output signal of the first logic circuit according to the delayed clock signal; and
- a second data latch, latching an output signal of the second logic circuit according to the delayed clock signal.

9. The time difference measurement circuit according to claim 8, wherein the decision circuit comprises:
- a third logic circuit, performing logic operations on an output signal of the first data latch, the delayed clock signal, and an enabling signal; and
- a fourth logic circuit, performing logic operations on an output signal of the second data latch, the delayed clock signal, and the enabling signal.

10. The time difference measurement circuit according to claim 9, wherein the decision circuit comprises:
- a multiplexer, selecting from an output signal of the third logic circuit and an output signal of the fourth logic circuit; and
- a first counter, counting an output signal of the multiplexer.

11. The time difference measurement circuit according to claim 9, wherein the decision circuit comprises:
- a second counter, counting an output signal of the third logic circuit; and
- a third counter, counting an output signal of the fourth logic circuit.

12. A time difference measurement circuit, for measuring a time difference between a reference clock signal and a clock signal output by a circuit under test comprising at least an oscillator, the time difference measurement circuit comprising: a synchronous dual-phase detector, coupled to the circuit under test, comprising a first delay buffer and a second delay buffer, wherein the first delay buffer and the second delay buffer delay the reference clock signal, and when the oscillator is in free run, a PDF of a phase of the clock signal is obtained, and a delay amount difference on the reference clock signal by the first delay buffer and the second delay buffer is calibrated according to the PDF of the phase of the clock signal; and a decision circuit, coupled to the synchronous dual-phase detector, for performing logic operations, data latching, and counting on a phase relationship detected by the synchronous dual-phase detector to obtain a counting value related to the time difference between the reference clock signal and the clock signal, wherein the first delay buffer delays the reference clock signal to generate a first delayed reference clock signal, the second delay buffer delays the reference clock signal to generate a second delayed reference clock signal, and the synchronous dual-phase detector further comprises a third delay buffer which delays the clock signal to generate the delayed clock signal; wherein the delay of the third delay buffer is between the delay of the first delay buffer and the delay of the second delay buffer.

13. The time difference measurement circuit according to claim 12, wherein the synchronous dual-phase detector comprises:
- a first phase detector, coupled to the first delay buffer and the third delay buffer for detecting a phase relationship between the first delayed reference clock signal and the delayed clock signal; and
- a second phase detector, coupled to the second delay buffer and the third delay buffer for detecting a phase relationship between the second delayed reference clock signal and the delayed clock signal;
- wherein the first phase detector and the second phase detector are reset after every sampling.

14. The time difference measurement circuit according to claim 13, wherein the decision circuit comprises:
- a first logic circuit, performing logic operations on an output signal of the first phase detector and an output signal of the second phase detector;
- a second logic circuit, performing logic operations on the output signal of the first phase detector and the output signal of the second phase detector;
- a first data latch, latching an output signal of the first logic circuit according to the delayed clock signal; and
- a second data latch, latching an output signal of the second logic circuit according to the delayed clock signal.

15. The time difference measurement circuit according to claim 14, wherein the decision circuit comprises:
- a third logic circuit, performing logic operations on an output signal of the first data latch, the delayed clock signal, and an enabling signal; and
- a fourth logic circuit, performing logic operations on an output signal of the second data latch, the delayed clock signal, and the enabling signal.

16. The time difference measurement circuit according to claim 15, wherein the decision circuit comprises:
- a multiplexer, selecting from an output signal of the third logic circuit and an output signal of the fourth logic circuit; and
- a first counter, counting an output signal of the multiplexer.

17. The time difference measurement circuit according to claim 15, wherein the decision circuit comprises:
- a second counter, counting an output signal of the third logic circuit; and
- a third counter, counting an output signal of the fourth logic circuit.

* * * * *